(12) United States Patent
Hondo

(10) Patent No.: US 8,894,892 B2
(45) Date of Patent: Nov. 25, 2014

(54) MOLD AND MANUFACTURING METHOD THEREFOR

(71) Applicant: Fujikura Ltd., Kohtoh-ku, Tokyo (JP)

(72) Inventor: Takaharu Hondo, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/873,814

(22) Filed: Apr. 30, 2013

(65) Prior Publication Data
US 2013/0243970 A1 Sep. 19, 2013

Related U.S. Application Data

(60) Division of application No. 13/534,763, filed on Jun. 27, 2012, now abandoned, which is a continuation of application No. PCT/JP2010/073606, filed on Dec. 27, 2010.

(30) Foreign Application Priority Data

Dec. 28, 2009 (JP) ................................ 2009-297933
Dec. 28, 2009 (JP) ................................ 2009-297954

(51) Int. Cl.
*B29C 59/16* (2006.01)
*H05K 3/00* (2006.01)
*H05K 3/10* (2006.01)

(52) U.S. Cl.
CPC ............... *B29C 59/16* (2013.01); *H05K 3/107* (2013.01); *H05K 3/0014* (2013.01); *H05K 2203/0108* (2013.01); *H05K 3/005* (2013.01)
USPC ......... 264/2.5; 425/385; 425/174.4; 264/219; 264/485

(58) Field of Classification Search
USPC .......... 264/2.5, 219, 485, 482; 425/174.4, 385
See application file for complete search history.

(56) References Cited

U.S. PATENT DOCUMENTS 3,510,380 A    5/1970   Bittner et al.
5,067,039 A *  11/1991  Godwin et al. ............... 360/135
(Continued)

FOREIGN PATENT DOCUMENTS

FR    2 597 910 A1   10/1987
JP    57-90999 A     6/1982
(Continued)

OTHER PUBLICATIONS

International Search Report for PCT/JP2010/073606 dated Mar. 1, 2011.

(Continued)

*Primary Examiner* — Joseph S Del Sole
*Assistant Examiner* — Nahida Sultana
(74) *Attorney, Agent, or Firm* — Sughrue Mion, PLLC

(57) ABSTRACT

Providing a mold and a manufacturing method therefor wherein protrusions are easy to be pressed into a resin base material and the protrusions are easy to be pulled out from the resin base material. The present invention provides a mold comprising a stamping surface (1a) formed depending on a via pattern and a protruding portion (21, 22) formed in convex shape from the stamping surface (1a), wherein the protruding portion has a base portion (111, 121) merging into a main surface of the stamping surface (1a) to have a curvature and a slope portion (113, 123) progressively decreasing in outer diameter thereof from the base portion (111, 121) to a top portion (112, 122) of the protruding portion (21, 22).

7 Claims, 40 Drawing Sheets

(56) References Cited

U.S. PATENT DOCUMENTS

| | | | |
|---|---|---|---|
| RE34,506 E * | 1/1994 | Dobbin et al. | 369/53.2 |
| 5,348,616 A * | 9/1994 | Hartman et al. | 216/48 |
| 5,383,998 A | 1/1995 | Lupke | |
| 5,421,927 A | 6/1995 | Macchiarulo et al. | |
| 6,136,414 A | 10/2000 | Aizawa et al. | |
| 6,173,496 B1 | 1/2001 | Makoui et al. | |
| 6,302,998 B1 | 10/2001 | Burgess | |
| 6,780,001 B2 * | 8/2004 | Eldridge et al. | 425/385 |
| 6,799,438 B2 | 10/2004 | Herzbach et al. | |
| 6,894,747 B2 * | 5/2005 | Okumura | 349/113 |
| 7,438,945 B2 | 10/2008 | Muramatsu et al. | |
| 7,687,126 B2 | 3/2010 | Fleming et al. | |
| 7,708,543 B2 * | 5/2010 | Shirotori et al. | 425/385 |
| 2003/0008109 A1 | 1/2003 | Basler et al. | |
| 2003/0021953 A1 | 1/2003 | Graff | |
| 2004/0137103 A1 | 7/2004 | Lin | |
| 2005/0064057 A1 * | 3/2005 | Morita | 425/192 R |
| 2005/0158455 A1 | 7/2005 | Muramatsu et al. | |
| 2006/0188704 A1 | 8/2006 | Mikami et al. | |
| 2007/0056704 A1 | 3/2007 | Wilke, II | |
| 2007/0216046 A1 | 9/2007 | Rudmann et al. | |
| 2008/0088050 A1 | 4/2008 | Yorita et al. | |
| 2008/0118697 A1 | 5/2008 | Takahashi et al. | |
| 2009/0197513 A1 | 8/2009 | Gouch et al. | |
| 2009/0314525 A1 | 12/2009 | Kajino et al. | |
| 2010/0009125 A1 | 1/2010 | Jeannot et al. | |
| 2010/0252955 A1 | 10/2010 | Agarwal et al. | |
| 2011/0068249 A1 | 3/2011 | Pan et al. | |
| 2012/0244320 A1 | 9/2012 | Sauter et al. | |
| 2012/0298617 A1 | 11/2012 | Lee | |

FOREIGN PATENT DOCUMENTS

| | | | |
|---|---|---|---|
| JP | 3-17294 A | 1/1991 | |
| JP | 05-318992 | 12/1993 | |
| JP | 2001-320150 A | 11/2001 | |
| JP | 2005-19438 A | 1/2005 | |
| JP | 2005-26412 A | 1/2005 | |
| JP | 2005-203586 A | 7/2005 | |
| TW | 2007183310 A | 5/2007 | |
| WO | 2006/054701 A1 | 5/2006 | |
| WO | WO2006129734 | * 12/2006 | H05K 3/10 |

OTHER PUBLICATIONS

Japanese Office Action for corresponding application JP 2001-547698 mailed Apr. 2, 2013.

Taiwanese Office Action for corresponding application TW 099146149 mailed Jan. 29, 2013.

Office Action issued in Taiwanese Application No. 099146149 dated Oct. 18, 2013.

Office Action issued by Chinese Patent Office in Chinese Application No. 201080059477.7 mailed Jun. 4, 2014.

* cited by examiner

MOLD AND MANUFACTURING METHOD THEREFOR

BACKGROUND OF THE INVENTION

1. Technical Field of the Invention

The present invention relates to a mold for forming via patterns and/or wiring patterns on a wiring board and a manufacturing method therefor.

For those designated countries which permit the incorporation by reference, the contents described and/or illustrated in the documents relevant to Patent Application No. 13/534,763 filed with the U.S. Patent Office on Jun. 27, 2012, which is a continuation of PCT/JP2010/073606, filed Dec. 27, 2010, claiming priority based of Patent Application No. 2009-297933 filed with Japan Patent Office on Dec. 28, 2009 and Patent application No. 2009-297954 filed with Japan Patent Office on Dec. 28, 2009 will be incorporated herein by reference, as a part of the description and/or drawings of the present application.

2. Description of the Related Art

Relating to imprinting method, known in the art are a technique in which a form is made for forming wiring patterns on an insulating layer using photolithography technique (Patent Document 1: Published Patent Application No. 2001-320150) and a technique in which steps of photolithography, plating and polishing are repeated to form a two-stage shaped form for forming via patterns and wiring patterns (Patent Document 2: Published Patent Application No. 2005-26412).

PRIOR ART DOCUMENTS

Patent Documents

[Patent Document 1] Published Patent Application No. 2001-320150
[Patent Document 2] Published Patent Application No. 2005-26412

SUMMARY OF THE INVENTION

Problems to be Solved by the Invention

According to the conventional techniques, however, protrusions having same or constant diameter are extended from the stamping surface of a mold (stamper) along the mold clamping direction thereby to lead to problems such that the protrusions are difficult to be pressed into a resin base material when clamping the mold with the resin base material and the protrusions are also difficult to be pulled out from the resin base material when releasing the mold from the resin base material.

Problems to be solved by the present invention, therefore, include providing a mold by which protrusions of the mold are easy to be pressed into a resin base material when clamping the mold with the resin base material and the protrusions are easy to be pulled out from the resin base material when releasing the mold from the resin base material, as well as providing the manufacturing method for the same.

Means for Solving the Problems (1) The present invention solves the above problems by providing a mold comprising a stamping surface formed depending on a pattern, wherein the stamping surface has a protruding portion formed in convex shape on a main surface side of the stamping surface depending on a via pattern, and wherein the protruding portion has a base portion merging into the main surface of the stamping surface to have a curvature and a slope portion progressively decreasing in outer diameter thereof from the base portion to a top portion of the protruding portion.

(2) In the above invention, the slope portion may be configured to have a substantially taper-shaped cross section along a moving direction of the stamping surface.

(3) In the above invention, the top portion may be configured in a shape having a curved surface.

(4) In the above invention, the mold may be configured to have a plurality of protruding portions with different heights.

(5) In the above invention, the mold may be configured such that the stamping surface further has a convex portion formed on the main surface side of the stamping surface depending on a wiring pattern and the base portion of the protruding portion merges into an upper surface of the convex portion to have a curvature.

(6) The present invention according to another aspect solves the above problems by providing a manufacturing method for a mold, comprising the steps of: preparing a resin plate body cured; forming a hole in the resin plate body depending on a via pattern by irradiating laser or electron beam to a main surface of the resin plate body; and using a mold material to fill the hole formed in the resin plate body and to cover the main surface of the resin plate body.

(7) In the above invention, the step of forming a hole in the resin plate body may include irradiating laser or electron beam to the resin plate body such that the hole formed in the resin plate body has at its opening area an inner wall merging into the main surface of the resin plate body with a curvature.

(8) In the above invention, the step of forming a hole in the resin plate body may include irradiating laser or electron beam to the resin plate body such that a slope wall is formed which progressively decreases in outer diameter thereof from an inner wall of opening area of the hole formed in the resin plate body to a bottom area.

(9) In the above invention, the step of forming a hole in the resin plate body may include irradiating laser or electron beam to the resin plate body such that a given energy by the laser or electron beam gradually decreases from an opening area of the hole to a bottom area of the hole.

(10) In the above invention, the step of forming a hole in the resin plate body may be such that a beam diameter of the laser when forming an opening area of the hole is larger than a beam diameter of the laser when forming a bottom area of the hole.

(11) In the present invention, the method may further comprise, after the step of forming a hole, the steps of: laminating a resist layer on the main surface of the resin plate body formed therein with the hole; and removing by photolithographic method the resist layer within a predetermined region including an opening region of the hole depending on a wiring pattern, wherein the step of using a mold material to fill the hole formed in the resin plate body may include covering with the mold material the resist layer removed therefrom the predetermined region and the main surface of the resin plate body.

Advantageous Effect of the Invention

According to the present invention, the protruding portion is formed to comprise the slope portion decreasing in its thickness from the base portion, which merges into the main surface of the stamping surface of the mold to have a curvature, to the top portion, thereby to provide a mold by which the protruding portion is easy to be pressed into a resin base material when clamping the mold with the resin base material and the protruding portion is easy to be pulled out from the resin base material when releasing the mold from the resin base material, as well as to provide the manufacturing method for the same.

DESCRIPTION OF THE PREFERRED EMBODIMENT (First Embodiment)

Hereinafter, a mold according to the present embodiment of this invention and a manufacturing method therefor will be described with reference to the drawings.

Figure 1:
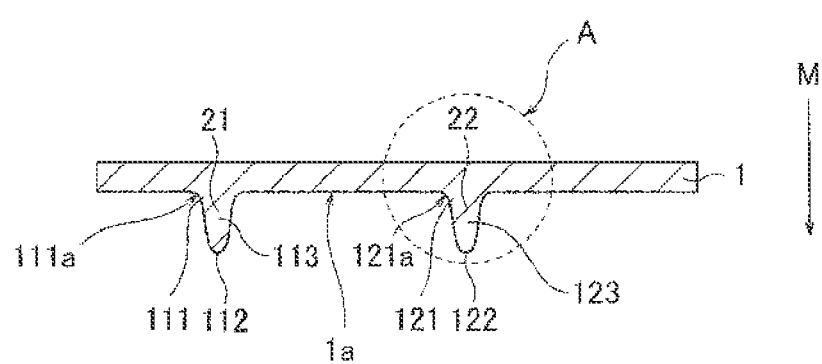
FIG. 1 is a cross-sectional view illustrating one example of a mold according to a first embodiment of the present invention.

FIG. 1 is a cross-sectional view of a mold 1 of the present embodiment along the mold clamping direction (arrow M in the figure). As shown in FIG. 1, the mold 1 of the present embodiment has a stamping surface 1a formed depending on patterns (including via patterns and wiring patterns) to be made on a wiring board. The stamping surface 1a according to the present invention functions as a working-purpose plate (original plate) for transferring to an insulating base material of a wiring board or the like a concave-convex shape (including protruding portions 21 and 22 depending on via patterns, and convex portions depending on wiring patterns as will be described later), which is used for constituting desired patterns. Although the reference character 1a in FIG. 1 specifies a point included in the stamping surface 1a, the stamping surface 1a is understood as being a concept which involves the entire surface formed thereon with a concave-convex shape including the protruding portions 21 and 22 used for constituting desired patterns.

The stamping surface 1a of the present embodiment has at least protruding portions 21 and 22 each formed in convex shape on the main surface side of this stamping surface 1a. No interface exists between the stamping surface 1a and the protruding portions 21 and 22, and the protruding portions 21 and 22 thus constitute parts of the stamping surface 1a. Although not particularly limited, the stamping surface 1a may be provided by a plate-like member having a certain thickness as shown in FIG. 1 or by a structure supported by another plate-like member (not shown). Note that, as mold materials for constituting the mold 1, metals such as copper (Cu) as well as resins or other appropriate materials may be used.

The protruding portions 21 and 22 of the present embodiment are formed into shapes having certain thicknesses (diameters), lengths and aspect ratios corresponding to those of holes of via patterns to be formed. The protruding portions 21 and 22 are such that, but not particularly limited, the diameter is about 5 µm to 15 µm, the height is about 10 µm to 40 µm, and the aspect ratio is about 1 to 4 and preferably about 1 to 2. While two protruding portions 21 and 22 are shown in FIG. 1, the arrangement and the number of protruding portion(s) 21, 22 are not particularly limited.

The protruding portions 21 and 22 of the present embodiment have base portions 111 and 121 which merge into the main surface of the stamping surface 1a with curved surfaces 111a and 121a having certain curvatures, and slope portions 113 and 123 which extend from these base portions 111 and 121 to top portions 112 and 122 of the protruding portions 21 and 22. Note that the main surface of the stamping surface 1a is a surface parallel to a plane moving when transferring or releasing.

Figure 2:
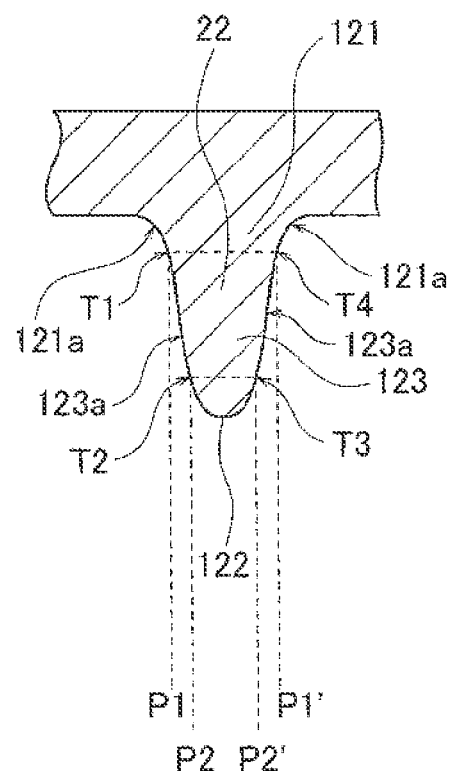
FIG. 2 is an enlarged view of a protruding portion shown as area A in FIG. 1.

FIG. 2 is an enlarged view of area A shown by dashed line in FIG. 1. As shown in FIG. 2, the protruding portion 22 of the present embodiment has the curved surface 121a at the base portion 121 as being a root portion thereof. The base portion 121 of the protruding portion 22 merges into the stamping surface 1a to have a certain curvature. Thus, a connecting portion between the stamping surface 1a and the protruding portion 22 is configured as the curved surface 121a, thereby allowing the protruding portion 22 to be easily pulled away from a resin base material when releasing. Moreover, the base portion 121, which supports the protruding portion 22 with high aspect ratio on the stamping surface 1a, is provided with the curved surface 121a, thereby also to allow for distributing the force acting on the base portion 121 to the curved surface 121a. Consequently, such a trouble that the protruding portion 22 may be broken at the root or the end of the protruding portion 22 may drop off is prevented from occurring. Note that only the protruding portion 22 is shown in FIG. 2 while the protruding portion 21 may also be configured in the same fashion.

Although not particularly limited, the protruding portions 21 and 22 of the present embodiment are such that the slope portions 113 and 123 are formed in cone-like shapes in which the diameters (thicknesses) or areas of cross sections parallel to the main surface of the stamping surface 1a progressively decrease as separating from the main surface of the stamping surface 1a (refer to FIG. 1). Specifically, as shown in the enlarged view of FIG. 2, the slope portion 123 of the protruding portion 22 of the present embodiment has a slope surface 123a which is formed such that the outer diameter (P1-P1') decreases as approaching the top portion 122 from the base portion 121. In other word, the distance (outer diameter: P1-P1') between points T1 and T4 on the surface of the protruding portion 22 shown in FIG. 2 progressively decreases as approaching the point T2 (T3) from the point T1 (T4) (P2-P2'<P1-P1'). Under this condition, the mold 1 may be configured such that the segment between the point T1 (T4) and the point T2 (T3) on the surface of the protruding portion 22 is represented by a straight line of y=ax ("a" is a positive or negative constant).

According to another aspect, as shown in FIG. 2, the cross-sectional shape of the slope portion 123 along the moving direction of the stamping surface 1a (arrow M direction in FIG. 1), such as the shape surrounded by points T1, T2, T3 and T4, may be made to be a substantially tapered shape.

Thus, the mold 1 of the present embodiment has the protruding portion 22 provided with the slope portion 123 progressively decreasing in thickness from the base portion 121, which merges into the main surface of the stamping surface 1a to have a certain curvature, to the top portion 122, thereby to result in that a portion with smaller cross section area is allowed to be pressed first into a resin base material during press fitting of the protruding portion 22 into the resin base material. This allows the resistance during the press fitting to be reduced.

Moreover, also during the releasing, the protruding portion 22 is avoided from getting lodged in the resin base material when being pulled off from the resin base material, because the protruding portion 22 has its thickness progressively decreasing toward the top portion 122.

Furthermore, the top portion 122 of the protruding portion 22 may be formed to have a curved surface. In this manner the curved surface is employed for an end portion when mold clamping with the resin base material thereby to allow for distributing the force acting on the protruding portion 22 during the press fitting.

Consequently, it is possible to provide the mold 1 in which the protruding portions 21 and 22 are easy to be pressed into a resin base material when clamping the mold 1 with the resin base material and also easy to be pulled out from the resin base material when releasing the mold 1 from the resin base material.

Manufacturing method for the mold 1 according to the present embodiment of this invention will hereinafter be described with reference to FIG. 3 to FIG. 6.

(1) First, a resin plate body 3 for taking the shape of the mold 1 and a supporting plate 2 for supporting this resin plate body 3 are prepared. As the supporting plate 2, a material removable by etching is used. Although not particularly limited, the present embodiment employs as the supporting plate 2 a copper foil with thickness of about 80 to 120 µm. The use of copper foil as the supporting plate 2 can suppress the supporting plate 2 from expanding or contracting when applying heat to the resin plate body 3. On the other hand, as the resin plate body 3, a material soluble in alkali or acid is used. Although not particularly limited, the present embodiment employs as the resin plate body 3 a light curable type or heat curable type resist film with thickness of about 15 to 40 μm, for example 25 μm.

Figure 3:
FIG. 3 is a cross-sectional view of a laminated body of a supporting plate and a resin plate body.

(2) Thereafter, as shown in FIG. 3, the resin plate body 3 is laminated on the main surface of the supporting plate 2 to be cured by light irradiation or heating. A separating treatment may be performed between the supporting plate 2 and the resin plate body 3.

Figure 4:
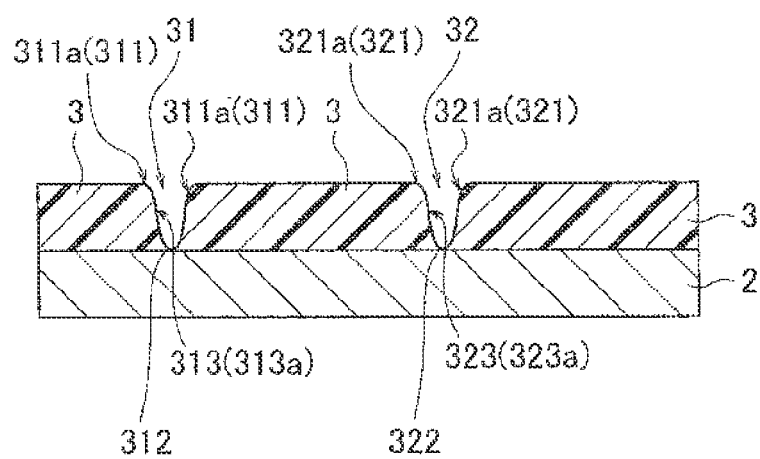
FIG. 4 is a process(midway) cross-sectional view illustrating a step for forming holes in the resin plate body.

(3) Subsequently, as shown in FIG. 4, laser or electron beam (EB) is irradiated to the main surface of the resin plate body 3 to form holes 31 and 32. Although not particularly limited, the holes 31 and 32 of the present embodiment of this invention are formed to be with diameter of about 5 to 15 μm and depth of about 10 to 40 μm. Excimer laser, femtosecond laser or other laser may be used as the laser. The irradiation direction of the laser or electron beam may be perpendicular direction with respect to the main surface of the resin plate body 3, or the irradiation may alternatively be performed with a certain angle other than right angle.

Although not particularly limited, in the present embodiment, the laser or electron beam may be irradiated to the resin plate body 3 such that the energy given by the laser or electron beam to the resin plate body 3 gradually decreases from opening areas 311 and 321 of the holes 31 and 32 to bottom areas 312 and 322 of the holes 31 and 32. For example, the step for forming the holes 31 and 32 may involve an approach for progressively decreasing with time the energy density of laser or an approach for progressively decreasing with time the number of shots. This allows for giving a larger energy to the opening areas 311 and 321 to provide a larger diameter in the vicinity of the opening areas 311 and 321 while decreasing the diameter of the holes 31 and 32 as progressing the laser drilling toward the bottom areas 312 and 322 from the opening areas 311 and 321 of the holes 31 and 32.

Moreover, by controlling the energy given by laser or electron beam, inner walls 311a and 321a of the opening areas 311 and 321 of the holes 31 and 32 can be made as being surfaces with certain curvatures, and body areas 313 and 323 merging into the opening areas 311 and 321 can be made as being slope walls 313a and 323a inclined with respect to the depth direction. Approaches for controlling the energy given by laser or electron beam may be experimentally achieved depending on various factors, such as, but not particularly limited to, type of the resin plate body 3, thickness of the resin plate body 3, type of the laser or electron beam, magnitude of energy to be given (energy density, the number of shots), and the distance between a light source and the resin plate body 3.

In addition, the step for forming the holes 31 and 32 may involve an approach of decreasing with time the beam diameter of laser light, such as excimer laser. For example, the beam diameter when forming the opening areas 311 and 321 of the holes 31 and 32 may be set as being larger than the beam diameter when forming the bottom areas 312 and 322 of the holes 31 and 32. This approach allows for providing a larger diameter of the opening areas 311 and 321 while decreasing the diameter of the holes 31 and 32 as progressing the laser drilling toward the bottom areas 312 and 322 from the opening areas 311 and 321 of the holes 31 and 32.

The holes 31 and 32 formed according to such approaches may be such that, as shown in FIG. 4, the inner walls 311a and 321a of the opening areas 311 and 321 are formed to merge into the main surface of the resin plate body 3 to have certain curvatures. Further, the body areas 313 and 323 may be formed to comprise the slope walls 313a and 323a of which outer diameters decrease as approaching the bottom areas 312 and 322 from the opening areas 311 and 321 of the holes 31 and 32 formed in the resin plate body 3.

Figure 5:
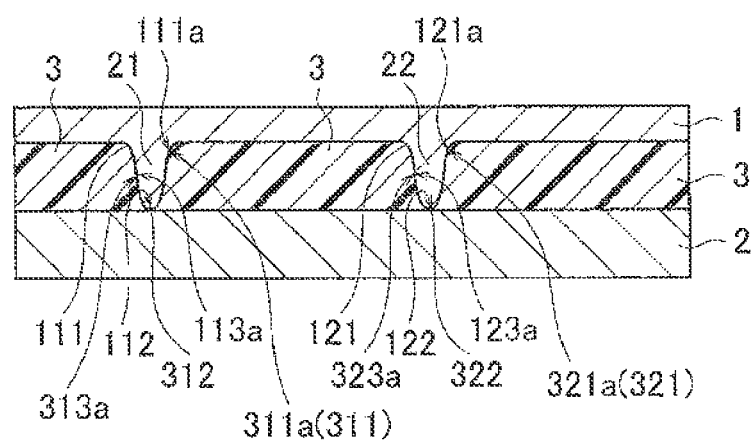
FIG. 5 is a process(midway) cross-sectional view illustrating a filling step with a mold material.

(4) Subsequently, as shown in FIG. 5, a mold material is used for filling the holes 31 and 32 formed in the resin plate body 3 and covering the main surface of the resin plate body 3.

Specifically, regions to be filled with the mold material, such as in the holes 31 and 32 of the resin plate body 3 and on the main surface of the resin plate body 3, are first formed thereon with a conductive layer to be a seed layer for the subsequent plating process or the like. This conductive layer is achieved by Direct Plating Process (DPP) using carbon (C), palladium (Pd) or other appropriate materials, or by sputtering using copper (Cu), nickel (Ni) or other appropriate materials. Thereafter, plating is performed using the mold material such as copper (Cu) or nickel (Ni) to fill the holes 31 and 32 with the mold material and cover the main surface of the resin plate body 3 with plated layer of the mold material. Of course, conductive nano-paste containing copper (Cu), silver (Ag) or other appropriate materials may be printed to fill the holes 31 and 32 with the mold material and cover the main surface of the resin plate body 3 therewith. Note, however, that an insulating material (nonconductive material) such as glass may also be used as the mold material aside from conductive materials.

Although not particularly limited, the present embodiment involves performing copper plating after having formed a cupper (Cu) layer with the thickness of about 100 to 300 nm by sputtering. The copper plated layer is formed on the resin plate body 3 with the thickness of about 10 to 50 μm to fill the holes 31 and 32 with the mold material and cover the main surface of the resin plate body 3 therewith.

This causes the protruding portions 21 and 22 to be formed, as shown in the figure, to comprise: the base portions 111 and 121 having the curved surfaces 111a and 121a within the holes 31 and 32 formed in the resin plate body 3; the slope portions 113 and 123; and the top portions 112 and 122. The curved surfaces 111a and 121a of the formed protruding portions 21 and 22 contact with the inner walls 311a and 321a of the holes 31 and 32, slope surfaces 113a and 123a of the protruding portions 21 and 22 contact with the slope walls 313a and 323a of the holes 31 and 32, and the top portions 112 and 122 of the protruding portions 21 and 22 contact with the bottom areas 312 and 322.

The holes 31 and 32 of the resin plate body 3 according to the present embodiment are such that the inner walls 311a and 321a of those opening areas 311 and 321 are formed with surfaces having certain curvatures to merge into the main surface of the resin plate body 3, and there is thus no corner area such as being formed by intersecting straight lines or flat planes. If such a corner area is formed on a subject to be plated thereon, the plating thickness at the corner area will tend to be different from that of the other areas. In contrast, according to the present embodiment, no corner area is formed within the opening areas 311 and 321, and the plated layer with uniform thickness can thus be formed on the inner walls 311a and 321a.

Moreover, since the slope walls 313a and 323a, of which the diameters decrease as approaching the bottom areas 312 and 322 from the inner walls 311a and 321a, have flat surfaces without irregularities and the opening planar dimensions gradually increase from the bottom areas 312 and 322 to the opening areas 311 and 321, the plated layer with uniform thickness can also be formed on the slope walls 313a and 323a and the bottom areas 312 and 322.

If, however, the plating thickness is of nonuniform, then stresses acting on the plated layer concentrate to generate strong force at a part thereof, whereas according to the present embodiment, the plated layer with uniform thickness is formed on the inner walls 311a and 321a of the opening areas 311 and 321, on the slope walls 313a and 323a, and on the bottom areas 312 and 322, thereby to prevent stresses from concentrating to act at a part of the plated layer (mold 1). Thus, according to the manufacturing method of the present embodiment, a highly durable mold 1 can be obtained which is capable of suppressing partial breakages from occurring.

Figure 6:
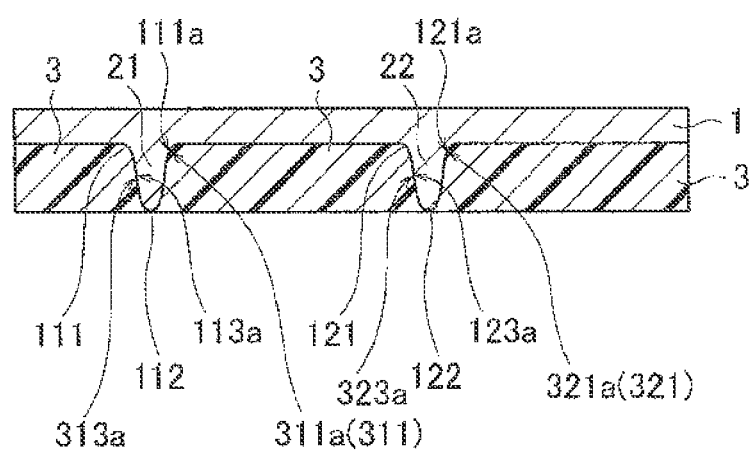
FIG. 6 is a process(midway) cross-sectional view illustrating a step for removing the supporting plate.

(5) Subsequently, as shown in FIG. 6, the supporting plate 2 is removed by using etching liquid such as ferric chloride solution to expose the surface of the resin plate body 3.

(6) Finally, the resin plate body 3 is also removed through swelling by using aqueous solution of sodium hydroxide or other appropriate liquid. This provides the mold 1 as shown in FIG. 1.

Conventionally, the shape of protruding portions has been constrained by the resolution of photolithography because photolithography technique has been used to form protruding portions for forming via patterns, and it has been difficult to make a fine shape with the diameter of 10 μm or less and the aspect ratio of 1 or more. In contrast, the manufacturing method for the mold 1 according to the present embodiment of this invention forms the holes 31 and 32 by using laser or electron beam, thereby to allow for forming in one step the fine holes 31 and 32 with reduced diameter (such as diameter of 10 μm or less) and increased aspect ratio (such as 1 or more).

Furthermore, according to the above method using laser or electron beam to form the holes 31 and 32, it is possible to form in one step a curved surface which is difficult to be formed by the photolithography steps.

In addition, according to the above method using laser or electron beam to form the holes 31 and 32, one step may be enough to make the inner walls 311a and 321a having certain curvatures, the slope walls 313a and 323a merging into the inner walls 311a and 321a and being inclined to the depth direction, and the bottom areas 312 and 322 merging into the slope walls 313a and 323a and being formed by curved surfaces, thereby to allow for manufacturing the mold 1 as shown in FIG. 1 with high productivity and reduced cost.

As in conventional techniques, via patterns may be directly formed in an insulating layer using ultraviolet (UV) laser, but the diameter of via patterns formed in an insulating layer is restricted to be about 30 μm or more. Further, via patterns with the diameter of about 10 μm may even be directly formed in an insulating layer using excimer laser, but wiring boards increase in cost because processing via patterns one by one requires long time and gases to be used such as krypton fluoride (KrF) is expensive. Given the foregoing, the present invention is advantageous in regard to that fine via patterns with the diameter of 10 μm or less can be formed in wiring boards at low cost by forming them using the mold 1 according to the present embodiment.

So-called imprinting method will hereinafter be described with reference to FIG. 7, for obtaining a wiring board using the mold 1 according to the present invention.

Figure 7:
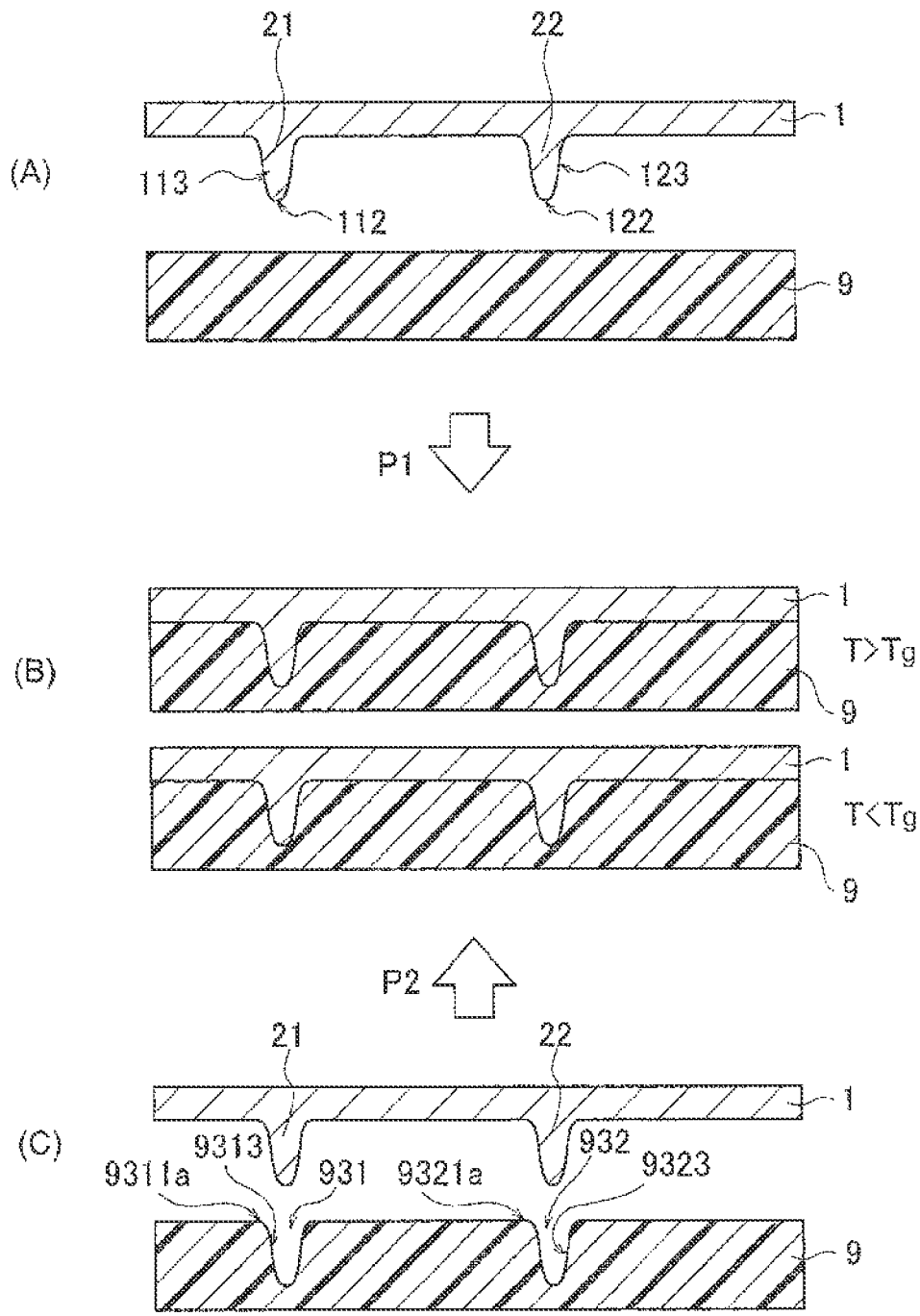
FIG. 7 depicts process(midway) cross-sectional views for explaining an imprinting method.

As shown in (A) of FIG. 7, the mold 1, and a transfer-purpose resin film 9 for constituting a wiring board, are prepared and they are arranged such that the main surface of the mold 1 opposes the main surface of the transfer-purpose resin film 9. The mold 1 is then caused to move along the direction where the mold 1 approaches the transfer-purpose resin film 9 (direction denoted by arrow P1).

Thereafter, as shown in (B) of FIG. 7, the mold 1 and the transfer-purpose resin film 9 are heated to a temperature equal to or above the glass transition temperature (Tg), and the mold 1 is pressed to the transfer-purpose resin film 9. The mold 1 and the transfer-purpose resin film 9 are then cooled below the glass transition temperature (Tg).

Subsequently, as shown in (C) of FIG. 7, the mold 1 is released in the direction where the mold 1 is separated from the transfer-purpose resin film 9 (arrow P2). This allows for transferring the patterns (including via patterns and wiring patterns, here and hereinafter) of the stamping surface 1a of the mold 1 to the main surface of the transfer-purpose resin film 9. As shown in the figure, after the release of the mold 1, the transfer-purpose resin film 9 is formed therein holes 931 and 932, which have inner walls 9311a and 9321a having certain curvatures around opening areas and slope walls 9313 and 9323 gradually decreasing in inner diameters thereof toward the bottom surfaces. The holes 931 and 932 formed in the transfer-purpose resin film 9 are of the same shapes as the holes 31 and 32 shown in FIG. 4.

Note that, as will be described later for the sixth embodiment, convex portions may be formed on the stamping surface 1a depending on wiring patterns to be connected with via patterns, thereby also forming trench portions for the wiring patterns on the transfer-purpose resin film 9. These trench portions may be filled with metal materials to provide a wiring board formed thereon with such wiring patterns.

Via patterns of the wiring board formed by using the mold 1 according to the present embodiment is formed thereon with no corner area such as being formed by intersecting straight lines or flat planes. That is, the main surface of the transfer-purpose resin film 9 (the surface formed thereon with via patterns and wiring patterns) and the opening areas of the holes 931 and 932 for via patterns merge into one another with the inner walls 9311a and 9321a having certain curvatures, thereby to result in that the occurrence of signal reflection can be prevented when transmitting signals through patterns of the accomplished wiring board. Even if high frequency signals, regarded as readily causing signal reflection, are transmitted, wiring boards formed using the mold 1 according to the present embodiment may prevent such signal reflection thereby to suppress the transmission loss of signals. This allows for providing wiring boards with excellent transmission characteristics.

Hereinafter, the second to the ninth embodiments will be described. Detailed descriptions for common elements will be represented by those for the first embodiment.

(Second Embodiment)

Figure 8:
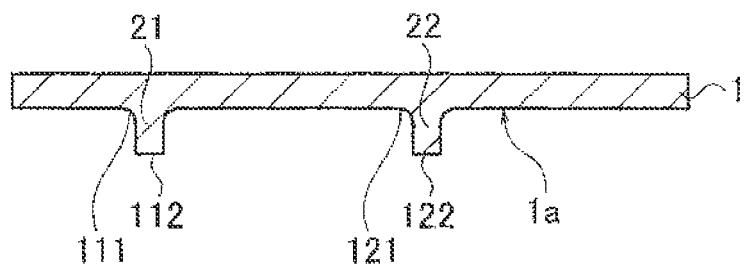
FIG. 8 is a cross-sectional view illustrating one example of a mold according to a second embodiment of the present invention.

Mold 1 according to the present embodiment comprises, as shown in FIG. 8, protruding portions 21 and 22 having base portions 111 and 121 connected with the main surface of stamping surface 1a of the mold 1 to have certain curvatures. The protruding portions 21 and 22 of the present embodiment have flat top portions 112 and 122, respectively. Thus, the base portions 111 and 121 of the protruding portions 21 and 22 are smoothly connected with the main surface of the stamping surface 1a of the mold 1 to have certain curvatures, thereby providing similar functionality and advantageous effect like the mold 1 of the first embodiment.

Figure 9:
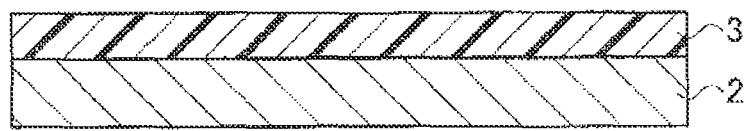
FIG. 9 is a cross-sectional view of a laminated body of a supporting plate and a resin plate body according to the second embodiment.
Figure 10:
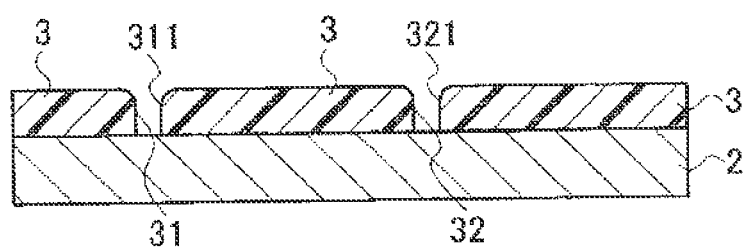
FIG. 10 is a process(midway) cross-sectional view illustrating a step for forming holes in the resin plate body according to the second embodiment.
Figure 11:
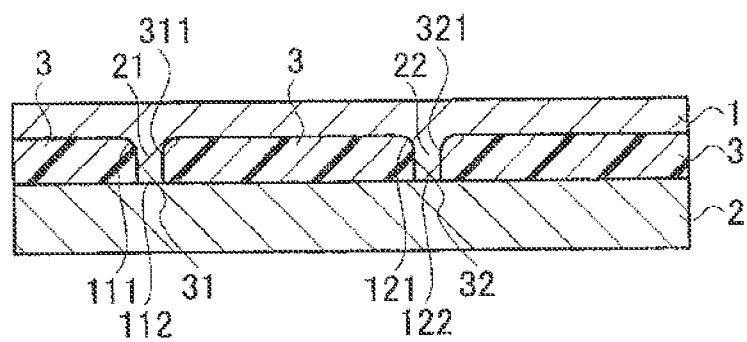
FIG. 11 is a process(midway) cross-sectional view illustrating a filling step with a mold material according to the second embodiment.
Figure 12:
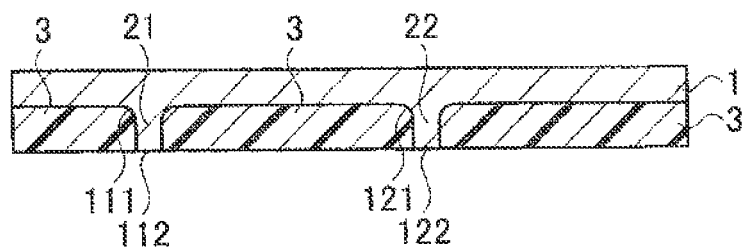
FIG. 12 is a process(midway) cross-sectional view illustrating a step for removing the supporting plate according to the second embodiment.

The manufacturing method for the mold 1 according to this second embodiment will be briefly described. Likewise the first embodiment, a laminated body of resin plate body 3 and supporting plate 2 is first prepared as shown in FIG. 9, and the resin plate body 3 is cured. Then, as shown in FIG. 10, laser or electron beam (EB) is irradiated to the main surface of the resin plate body 3 to form holes 31 and 32 (penetrating holes). The holes 31 and 32 of the resin plate body 3 according to the present embodiment are formed such that inner walls of opening areas 311 and 321 merge into the main surface of the resin plate body 3 with surfaces having certain curvatures. Subsequently, as shown in FIG. 11, mold material is used to fill the holes 31 and 32 formed in the resin plate body 3 and to cover the main surface of the resin plate body 3. Thereafter, as shown in FIG. 12, the supporting plate 2 is removed by using etching liquid such as ferric chloride solution. Finally, the resin plate body 3 is also removed through swelling by using aqueous solution of sodium hydroxide or other appropriate liquid. This provides the mold 1 as shown in FIG. 8. Thus, laser or electron beam (EB) is irradiated to the main surface of the resin plate body 3 to form the holes 31 and 32, thereby providing similar operation and advantageous effect like the manufacturing method for the mold 1 of the first embodiment.

(Third Embodiment)

Figure 13:
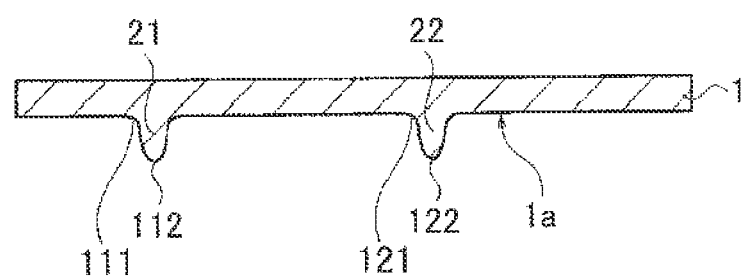
FIG. 13 is a cross-sectional view illustrating one example of a mold according to a third embodiment of the present invention.

Mold 1 according to the present embodiment has, as shown in FIG. 13, a common configuration with the mold 1 according to the first embodiment, wherein base portions 111 and 121 of protruding portions 21 and 22 are connected with the main surface of stamping surface 1a of the mold 1 to have certain curvatures and top portions 112 and 122 are configured as being curved surfaces. Consequently, the mold 1 according to the present embodiment provides similar functionality and advantageous effect like the mold 1 of the first embodiment.

Figure 14:
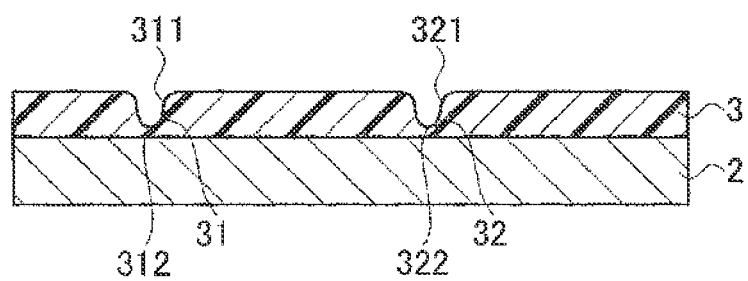
FIG. 14 is a process(midway) cross-sectional view illustrating a step for forming holes in a resin plate body according to the third embodiment.

The manufacturing method for the mold 1 according to this third embodiment will be briefly described. Likewise the first embodiment, a laminated body of resin plate body 3 and supporting plate 2 is first prepared as shown in FIG. 9, and the resin plate body 3 is cured. Then, as shown in FIG. 14, laser or electron beam (EB) is irradiated to the main surface of the resin plate body 3 to form holes 31 and 32. The holes 31 and 32 of the resin plate body 3 according to the present embodiment are formed such that inner walls of opening areas 311 and 321 merge into the main surface of the resin plate body 3 with surfaces having certain curvatures. At this time, the present embodiment reduces the strength and/or the number of irradiating shots of laser or electron beam compared to the irradiation process in the second embodiment, so that the holes 31 and 32 with the depth of about 10 to 25 μm are formed in the resin plate body 3 not to penetrate the resin plate body 3 as shown in FIG. 14. The formed holes 31 and 32 have bottom areas 312 and 322 comprised of curved surfaces.

Figure 15:
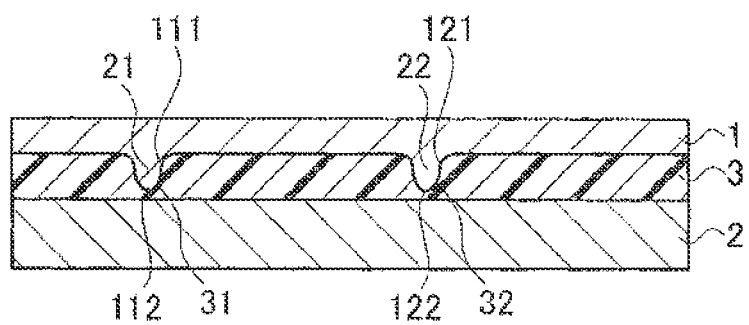
FIG. 15 is a process(midway) cross-sectional view illustrating a filling step with a mold material according to the third embodiment.
Figure 16:
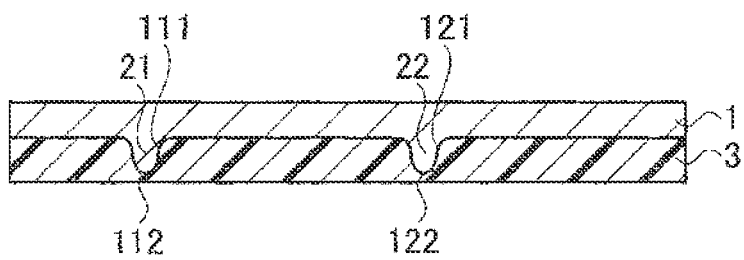
FIG. 16 is a process(midway) cross-sectional view illustrating a step for removing a supporting plate according to the third embodiment.

Subsequently, as shown in FIG. 15, mold material is used to fill the holes 31 and 32 formed in the resin plate body 3 and to cover the main surface of the resin plate body 3. Thereafter, as shown in FIG. 16, the supporting plate 2 is removed by using etching liquid such as ferric chloride solution. Finally, the resin plate body 3 is also removed through swelling by using aqueous solution of sodium hydroxide or other appropriate liquid. This provides the mold 1 as shown in FIG. 13. The present embodiment uses laser or electron beam to form the holes 31 and 32 not penetrating the resin plate body 3, thereby to allow for forming the protruding portions 21 and 22 with the top portions 112 and 122 comprised of curved surfaces. In addition, the present embodiment provides similar operation and advantageous effect like the manufacturing method for the mold 1 of the first embodiment.

(Fourth Embodiment)

Figure 17:
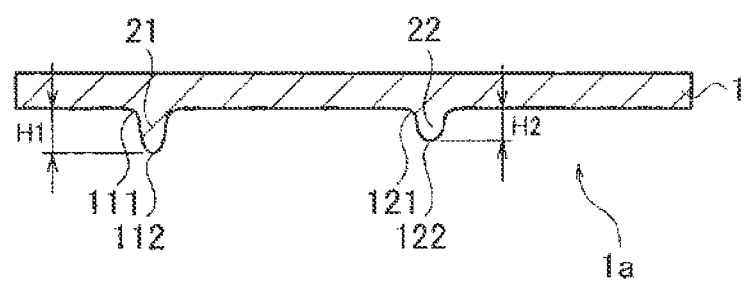
FIG. 17 is a cross-sectional view illustrating one example of a mold according to a fourth embodiment of the present invention.

Mold 1 according to the present embodiment has protruding portions 21 and 22 with different heights. As shown in FIG. 17, the protruding portions 21 and 22 of the present embodiment have different heights H1 and H2, respectively. This allows for providing the mold 1 capable of forming via patterns with different depths during one time transferring step, and similar functionality and advantageous effect like the first embodiment are obtained.

Figure 18:
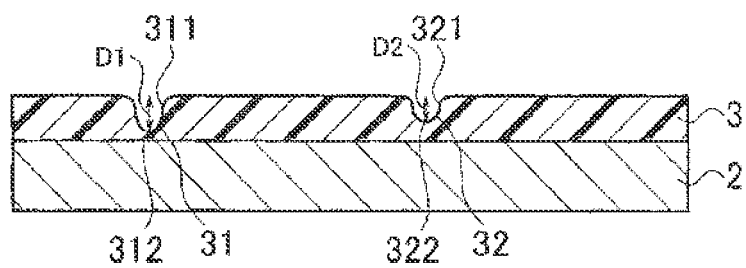
FIG. 18 is a process(midway) cross-sectional view illustrating a step for forming holes in a resin plate body according to the fourth embodiment.

The manufacturing method for the mold 1 according to this fourth embodiment will be briefly described. Likewise the first embodiment, a laminated body of resin plate body 3 and supporting plate 2 is first prepared as shown in FIG. 9, and the resin plate body 3 is cured. Then, as shown in FIG. 18, laser or electron beam (EB) is irradiated to the main surface of the resin plate body 3 to form holes 31 and 32. At this time, the present embodiment controls the strength and/or the number of irradiating shots of laser or electron beam to form the holes 31 and 32 with target depths D1 and D2 in the resin plate body 3.

Figure 19:
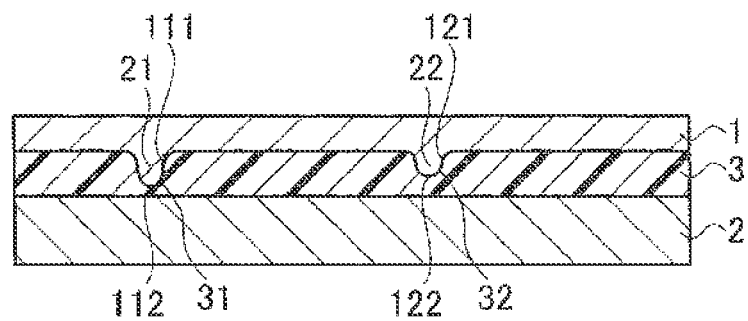
FIG. 19 is a process(midway) cross-sectional view illustrating a filling step with a mold material according to the fourth embodiment.
Figure 20:
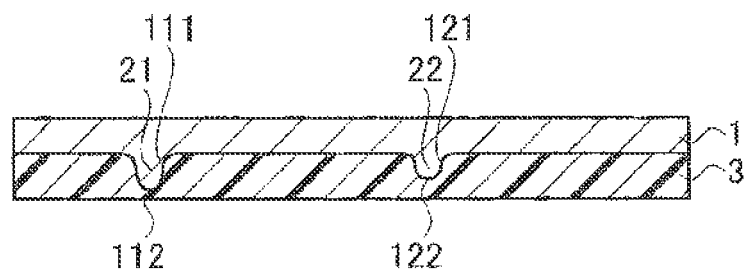
FIG. 20 is a process(midway) cross-sectional view illustrating a step for removing a supporting plate according to the fourth embodiment.

The holes 31 and 32 of the present embodiment have bottom areas 312 and 322 comprised of curved surfaces because of not penetrating the resin plate body 3. Subsequently, as shown in FIG. 19, mold material is used to fill the holes 31 and 32 formed in the resin plate body 3 and to cover the main surface of the resin plate body 3. Thereafter, as shown in FIG. 20, the supporting plate 2 is removed by using etching liquid such as ferric chloride solution, and the resin plate body 3 is also removed through swelling by using aqueous solution of sodium hydroxide or other appropriate liquid. This provides the mold 1 as shown in FIG. 17. Thus, the present embodiment irradiates laser or electron beam (EB) to the main surface of the resin plate body 3 to form the holes 31 and 32 thereby to allow for making the holes 31 and 32 with different depths during one step, and similar operation and advantageous effect like the manufacturing method for the mold 1 of the first embodiment are obtained.

In fact, when using photolithographic technique, it is difficult to form holes for via patterns with different depths during one step. In contrast, the present embodiment can control the number of shots and/or the strength of laser or electron beam thereby to form the holes 31 and 32 with freely selected depths during one step, and thus also to produce the mold 1 compatible with various types of patterns.

(Fifth Embodiment)

Figure 21:
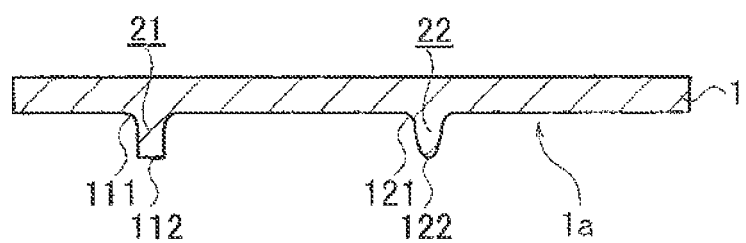
FIG. 21 is a cross-sectional view illustrating one example of a mold according to a fifth embodiment of the present invention.

Mold 1 according to the present embodiment has protruding portions 21 and 22 of which top portions 112 and 122 are with different shapes. In the example shown in FIG. 21, the protruding portion 21 has a flat top portion 112 while the protruding portion 22 has a top portion 122 comprised of a curved surface. This allows for providing the mold 1 which is capable of forming via patterns as a combination of penetrating vias and non-penetrating vias during one transferring step, and similar functionality and advantageous effect like the first embodiment are obtained.

Here, when forming the flat top portion 112, hole 31 is formed to penetrate resin plate body 3, whereas when forming the top portion 122 comprised of a curved surface, hole 32 is formed not to penetrate the resin plate body 3. The present embodiment uses laser or electron beam to form the holes 31 and 32, thereby allowing to form during one step a form for making the mold 1, which is applicable to the combination of penetrating vias and non-penetrating vias, and similar operation and advantageous effect like the manufacturing method for the mold 1 of the first embodiment are obtained.

(Sixth Embodiment)

Figure 22:
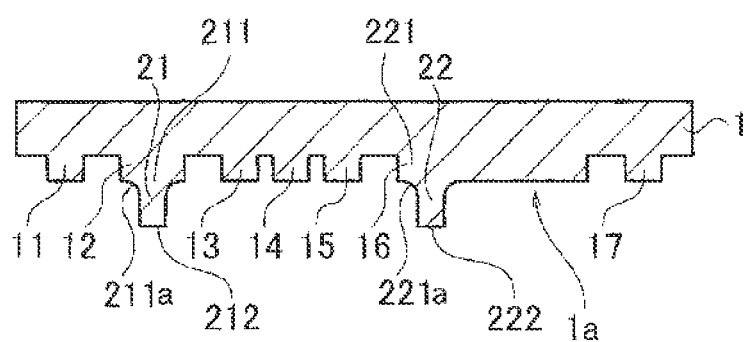
FIG. 22 is a cross-sectional view illustrating one example of a mold according to a sixth embodiment of the present invention.

As shown in FIG. 22, stamping surface 1a of mold 1 according to the present embodiment of this invention is formed thereon with convex portions 11 to 17, which are formed on the main surface side of the stamping surface 1a depending on wiring patterns. Further, base portions 211 and 221 of protruding portions 21 and 22, which depend on via patterns, merge into upper surfaces of the convex portions 11 to 17 (surfaces parallel to the main surface of the stamping surface 1a, here and hereinafter) with curved surfaces 211a and 221a. More specifically, the protruding portions 21 and 22 have top portions 212 and 222 higher than the convex portions 11 to 17, and base portions 211 and 221 connected to the upper surfaces of the convex portions 12 and 16 with the curved surfaces 211a and 221a having certain curvatures. No interface exists between the stamping surface 1a and the convex portions 11 to 17 and between the convex portions 12 and 16 and the protruding portions 21 and 22, and the mold 1 is thus formed as one body. Likewise the first embodiment, cupper (Cu) or other appropriate material may be used as mold material for constituting the mold 1.

As shown in the figure, the protruding portions 21 and 22 of the present embodiment have flat top portions 212 and 222, respectively. Note that shapes of the protruding portions 21 and 22 may be selected in a similar fashion as the previously-described embodiment.

The mold 1 of the present embodiment is configured such that the base portions 211 and 221 of the protruding portions 21 and 22 are smoothly connected with the upper surfaces (surfaces parallel to the stamping surface 1a) of the convex portions 11 to 17 to have certain curvatures, thereby providing similar functionality and advantageous effect like the first embodiment.

The manufacturing method for the mold 1 according to this sixth embodiment will be briefly described.

Figure 23:
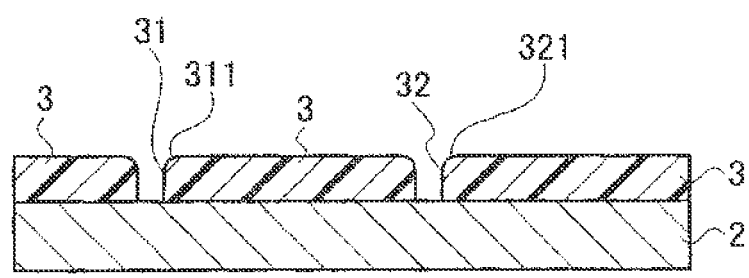
FIG. 23 is a process(midway) cross-sectional view illustrating a step for forming holes in a resin plate body according to the sixth embodiment.
Figure 24:
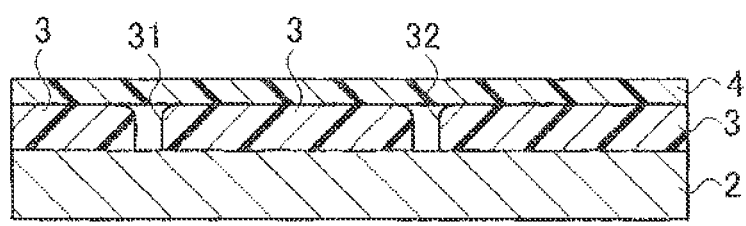
FIG. 24 is a process(midway) cross-sectional view illustrating a step for laminating a resist layer according to the sixth embodiment.

Likewise the first embodiment, a laminated body of resin plate body 3 and supporting plate 2 is first prepared as shown in FIG. 9, and the resin plate body 3 is cured. Then, as shown in FIG. 23, laser or electron beam (EB) is irradiated to the main surface of the resin plate body 3 to form holes (penetrating holes) 31 and 32. The holes 31 and 32 of the resin plate body 3 according to the present embodiment are formed such that inner walls of opening areas 311 and 321 merge into the main surface of the resin plate body 3 with surfaces having certain curvatures. Subsequently, as shown in FIG. 24, resist layer 4 is formed on the resin plate body 3 so as not to fill the inside of the holes 31 and 32. As the resist layer 4, film-like one may be used which is soluble in alkali or acid and with the thickness of about 5 to 20 μm.

Figure 25:
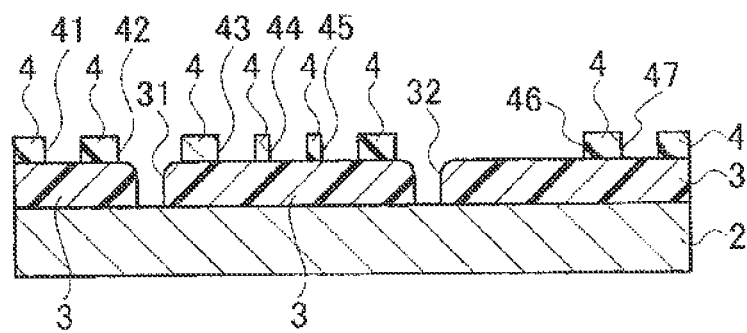
FIG. 25 is a process(midway) cross-sectional view illustrating a step for removing a predetermined region of the resist layer according to the sixth embodiment.

Thereafter, as shown in FIG. 25, photolithography method is employed to remove a predetermined region of the resist layer 4, which includes regions covering opening area regions of the holes 31 and 32, depending on wiring patterns. Specifically, patterning is performed in which a photomask and an exposure apparatus are used to expose the resist layer 4 and the predetermined region of the resist layer 4 is selectively removed through alkaline development or acidic development. As a result of this, the opening area regions of the holes 31 and 32 are opened (come to be a state where the holes 31 and 32 are not closed), and trenches 41 to 47 of the resist layer 4 are formed. The formed trenches 42 and 46 merge into the previously formed holes 31 and 32, and step-like (two-stage shaped) patterns are defined by the main surface of the resin plate body 3, which merges into opening areas 311 and 321 of the holes 31 and 32, and the main surface (on the side of light source of the exposure) of the resist layer 4, which forms the trenches 42 and 46. Although not particularly limited, line-and-space area configured by the trenches 41 to 47 may be such that the wiring width is about 5 to 20 μm and the wiring space is also about 5 to 20 μm, and the land diameter of via patterns may be 50 to 120 μm.

Figure 26:
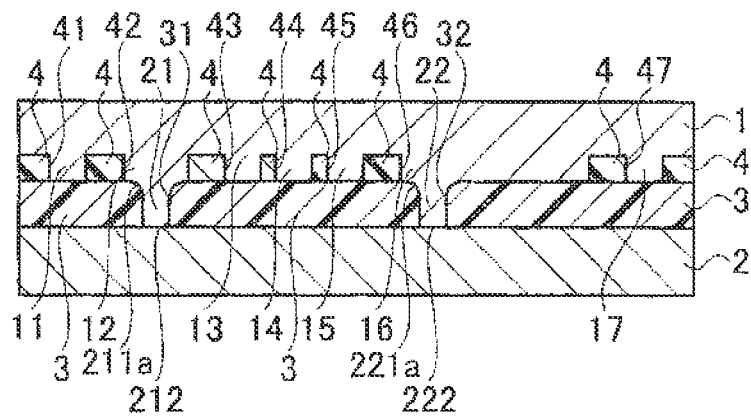
FIG. 26 is a process(midway) cross-sectional view illustrating a filling step with a mold material according to the sixth embodiment.
Figure 27:
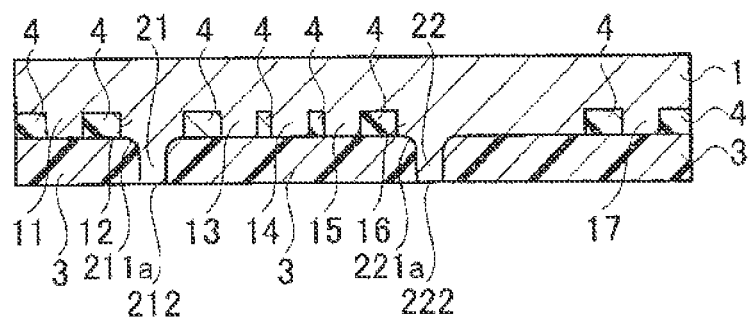
FIG. 27 is a process(midway) cross-sectional view illustrating a step for removing a supporting plate according to the sixth embodiment.

Subsequently, as shown in FIG. 26, mold material is used to cover the main surface of the resin plate body 3 and the resist layer 4, from which the predetermined region including the regions covering the opening area regions has been removed. That is, the mold material fills the holes 31 and 32 formed in the resin plate body 3 and the trenches 41 to 47, and covers the upper surfaces and side surfaces of the resist layer 4 and the main surface of the resin plate body 3. Approaches for plating and other treatments are common to those in the first embodiment. Thereafter, as shown in FIG. 27, the supporting plate 2 is removed by using etching liquid such as ferric chloride solution. Finally, the resin plate body 3 is also removed through swelling by using aqueous solution of sodium hydroxide or other appropriate liquid. This provides the mold 1 as shown in FIG. 22.

The manufacturing method for the mold 1 according to the present embodiment of this invention forms the two-stage shaped patterns having the holes 31 and 32 by laser or electron beam and the trenches 41 to 47, thereby to allow for forming the protruding portions 21 and 22 and the convex portions 11 to 17 through one time plating process (one step).

As an approach to form protruding portions for forming via patterns and convex portions for forming wiring patterns, a construction method is known in which steps of photolithography, plating and polishing are repeated to build up respective portions. The present embodiment forms the holes 31 and 32 for via patterns using laser or other means, followed by the formation of the trenches 41 to 47 for wiring patterns, thereafter filling the holes 31 and 32 and the trenches 41 to 47 with the mold material in one step, and therefore, the present embodiment requires no polishing step for top portions of protruding portions for via patterns thereby to simplify the steps, compared to the conventional approach where convex portions for wiring patterns are formed and protruding portions for via patterns are then formed on those convex portions. Note that the holes 31 and 32 may be formed in the underlying resin plate body after patterning the resist layer 4. This modification in the order of steps is also applicable to the seventh to the ninth embodiments as will be described below.

Moreover, the present embodiment provides similar functionality and advantageous effect like the first embodiment because this embodiment forms the holes 31 and 32 using laser or electron beam thereby to allow for forming the protruding portions 21 and 22 which have the base portions 211 and 221 smoothly merging into the upper surfaces of the convex portions 12 and 16 to have certain curvatures, and which may not be obtained by photolithography process.

(Seventh Embodiment)

Figure 28:
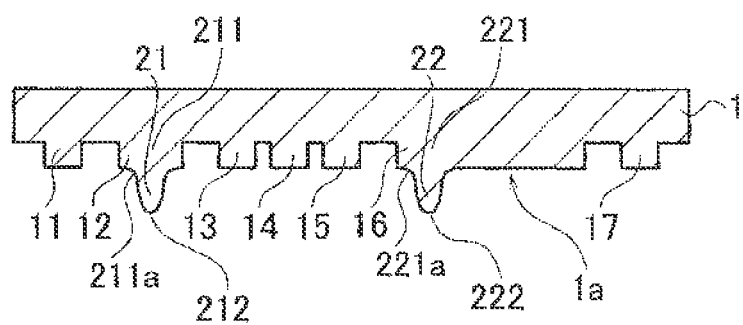
FIG. 28 is a cross-sectional view illustrating one example of a mold according to a seventh embodiment of the present invention.

Mold 1 according to the seventh embodiment of this invention has features including that, as shown in FIG. 28, base portions 211 and 221 of protruding portions 21 and 22 are connected to upper surfaces of convex portions 12 and 16 with curved surfaces 211a and 221a having certain curvatures, the protruding portions 21 and 22 have top portions 212 and 222 comprised of curved surfaces, and the protruding portions 21 and 22 gradually decrease in their thicknesses toward the top portions 212 and 222. Consequently, the mold 1 of the present embodiment provides similar functionality and advantageous effect like the first and the sixth embodiments.

The manufacturing method for the mold 1 according to this seventh embodiment will be briefly described.

Figure 29:
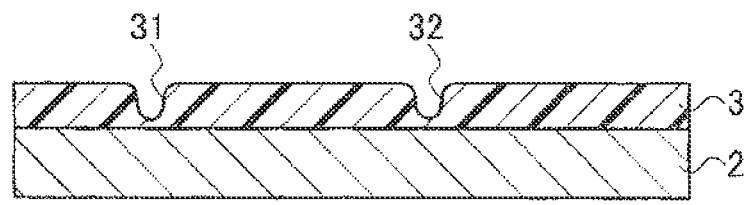
FIG. 29 is a process(midway) cross-sectional view illustrating a step for forming holes in a resin plate body according to the seventh embodiment.

Likewise the first embodiment, a laminated body of resin plate body 3 and supporting plate 2 is first prepared as shown in FIG. 9, and the resin plate body 3 is cured. Then, as shown in FIG. 29, laser or electron beam (EB) is irradiated to the main surface of the resin plate body 3 to form holes 31 and 32. At this time, the present embodiment reduces the strength and/or the number of irradiating shots of laser or electron beam compared to the irradiation process in the sixth embodiment, so that the holes 31 and 32 with the depth of about 10 to 20 μm are formed in the resin plate body 3 not to penetrate the resin plate body 3 as shown in FIG. 29. The formed holes 31 and 32 have bottom areas 312 and 322 comprised of curved surfaces. The holes 31 and 32 of the resin plate body 3 according to the present embodiment is such that inner walls of opening areas 311 and 321 are formed to merge into the main surface of the resin plate body 3 with curved surfaces having certain curvatures, and the inner walls gradually decrease in their outer diameters toward the bottom areas.

Figure 30:
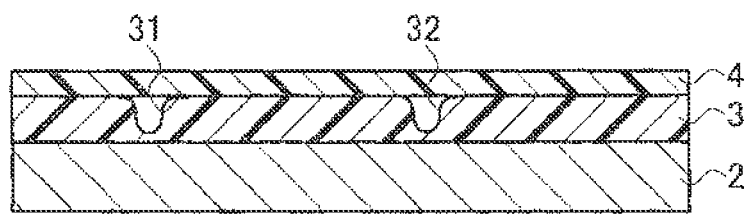
FIG. 30 is a process(midway) cross-sectional view illustrating a step for laminating a resist layer according to the seventh embodiment.
Figure 31:
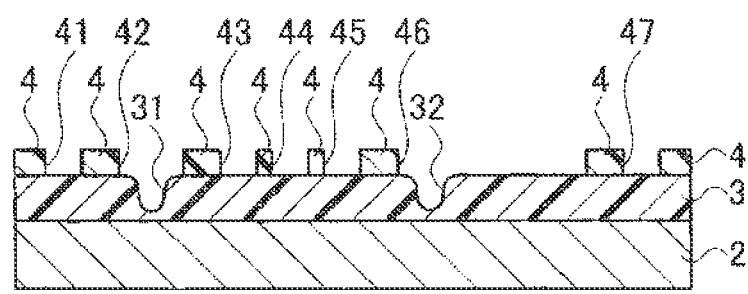
FIG. 31 is a process(midway) cross-sectional view illustrating a step for removing a predetermined region of the resist layer according to the seventh embodiment.

Subsequently, as shown in FIG. 30, resist layer 4 is formed on the resin plate body 3 so as not to fill the inside of the holes 31 and 32. Thereafter, as shown in FIG. 31, photolithography method is employed to remove a predetermined region of the resist layer 4, which includes regions covering opening area regions of the holes 31 and 32, depending on wiring patterns. As shown in the figure, the opening area regions of the holes 31 and 32 are opened (come to be a state where the holes 31 and 32 are not closed), and trenches 41 to 47 of the resist layer 4 are formed. The formed trenches 42 and 46 merge into the previously formed holes 31 and 32, and step-like (two-stage shaped) patterns are defined by the main surface of the resin plate body 3, which merges into opening areas 311 and 321 of the holes 31 and 32, and the main surface (on the side of light source of the exposure) of the resist layer 4, which forms the trenches 42 and 46.

Figure 32:
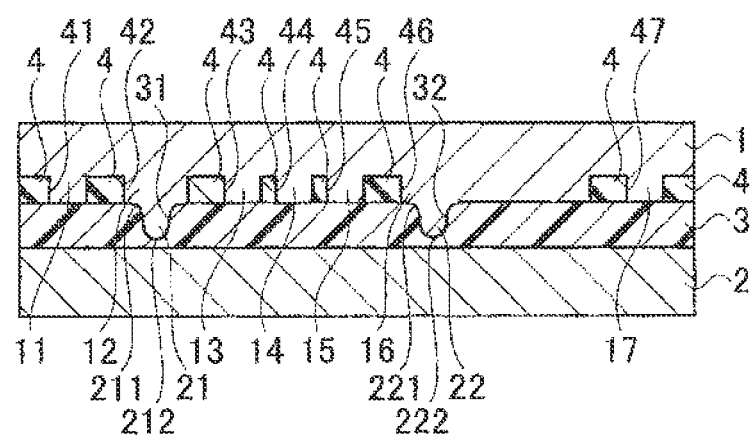
FIG. 32 is a process(midway) cross-sectional view illustrating a filling step with a mold material according to the seventh embodiment.
Figure 33:
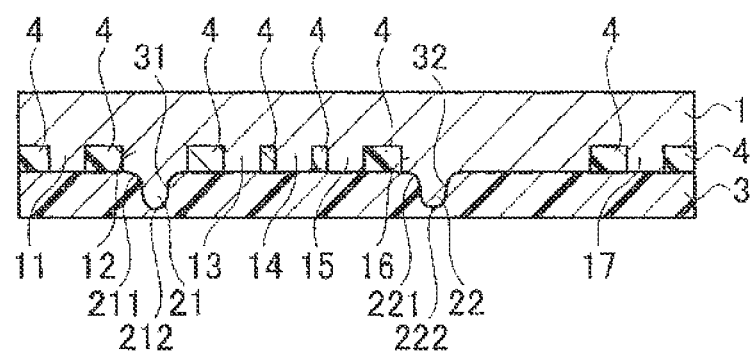
FIG. 33 is a process(midway) cross-sectional view illustrating a step for removing a supporting plate according to the seventh embodiment.

Subsequently, as shown in FIG. 32, mold material is used to cover the main surface of the resin plate body 3 and the resist layer 4, from which the predetermined region including the regions covering the opening area regions has been removed. Thereafter, as shown in FIG. 33, the supporting plate 2 is removed by using etching liquid such as ferric chloride solution. Finally, the resin plate body 3 is also removed through swelling by using aqueous solution of sodium hydroxide or other appropriate liquid. This provides the mold 1 as shown in FIG. 28.

The manufacturing method for the mold 1 according to the present embodiment of this invention forms the two-stage shaped patterns having the holes 31 and 32 by laser or electron beam and the trenches 41 to 47, thereby to allow for forming the protruding portions 21 and 22 and the convex portions 11 to 17 through one time plating process (one step), and to provide similar operation and advantageous effect like the first and the sixth embodiments.

(Eighth Embodiment)

Figure 34:
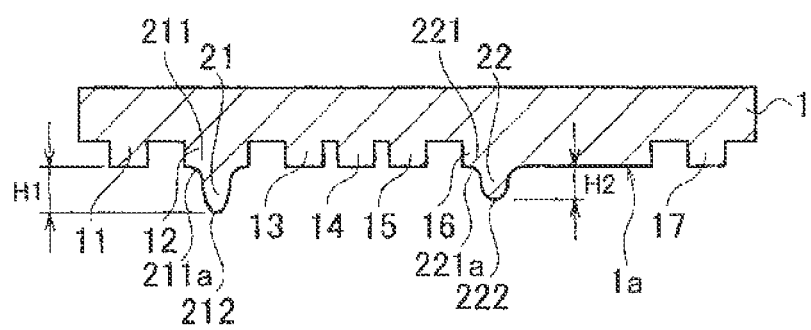
FIG. 34 is a cross-sectional view illustrating one example of a mold according to an eighth embodiment of the present invention.

Mold 1 according to the present embodiment is such that, as shown in FIG. 34, protruding portions 21 and 22 of the present embodiment have different heights H1 and H2, respectively. This allows for providing the mold 1 capable of forming via patterns with different depths during one time transferring step, and similar functionality and advantageous effect like the first and the sixth embodiments are obtained.

Figure 35:
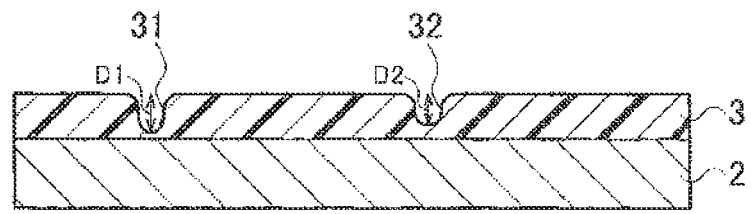
FIG. 35 is a process(midway) cross-sectional view illustrating a step for forming holes in a resin plate body according to the eighth embodiment.

The manufacturing method for the mold 1 according to this eighth embodiment will be briefly described. Likewise the first embodiment, a laminated body of resin plate body 3 and supporting plate 2 is first prepared as shown in FIG. 9, and the resin plate body 3 is cured. Then, as shown in FIG. 35, laser or electron beam (EB) is irradiated to the main surface of the resin plate body 3 to form holes 31 and 32. At this time, the present embodiment controls the strength and/or the number of irradiating shots of laser or electron beam to form the holes 31 and 32 with target depths D1 and D2 in the resin plate body 3. The holes 31 and 32 of the present embodiment respectively have bottom areas 312 and 322 comprised of curved surfaces because of not penetrating the resin plate body 3.

Figure 36:
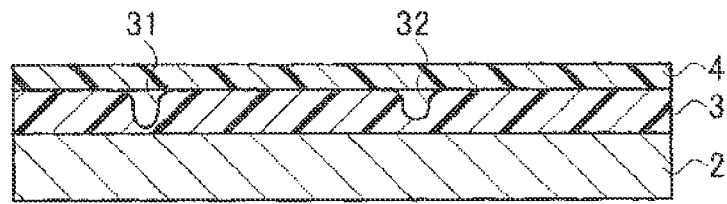
FIG. 36 is a process(midway) cross-sectional view illustrating a step for laminating a resist layer according to the eighth embodiment.
Figure 37:
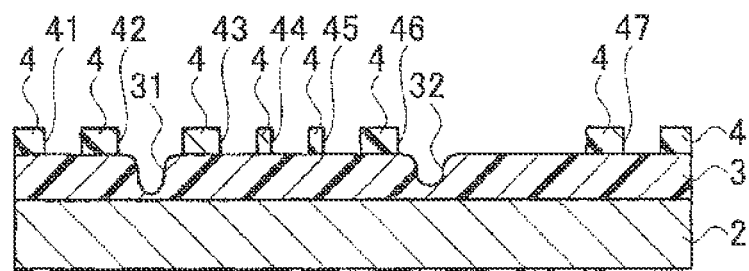
FIG. 37 is a process(midway) cross-sectional view illustrating a step for removing a predetermined region of the resist layer according to the eighth embodiment.

Subsequently, as shown in FIG. 36, resist layer 4 is formed on the resin plate body 3. Thereafter, as shown in FIG. 37, photolithography method is employed to remove a predetermined region of the resist layer 4, which includes regions covering opening area regions of the holes 31 and 32, depending on wiring patterns. Trenches 42 and 46 of the resist layer 4 merge into the previously formed holes 31 and 32. Step-like (two-stage shaped) patterns are thus defined by the main surface of the resin plate body 3, which merges into opening areas 311 and 321 of the holes 31 and 32, and the main surface (on the side of light source of the exposure) of the resist layer 4, which forms the trenches 42 and 46.

Figure 38:
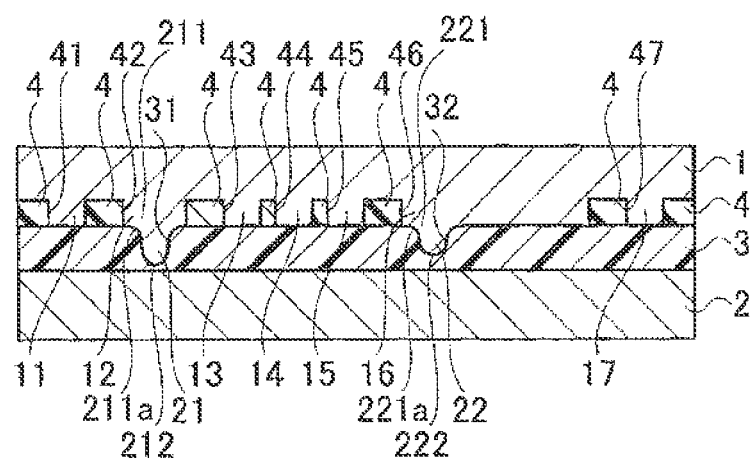
FIG. 38 is a process(midway) cross-sectional view illustrating a filling step with a mold material according to the eighth embodiment.
Figure 39:
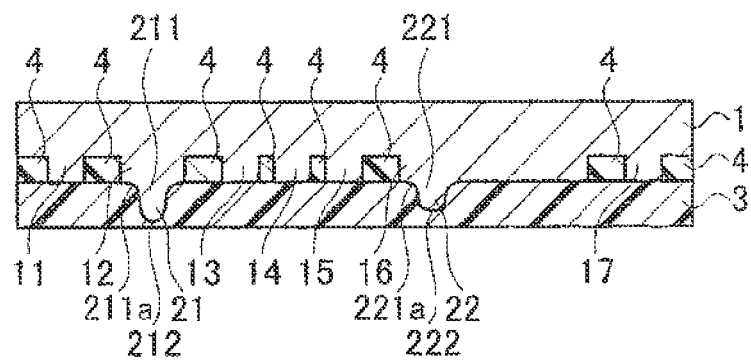
FIG. 39 is a process(midway) cross-sectional view illustrating a step for removing a supporting plate according to the eighth embodiment.

Subsequently, as shown in FIG. 38, mold material is used to cover the main surface of the resin plate body 3 and the resist layer 4, from which the predetermined region including the regions covering the opening area regions has been removed. Thereafter, as shown in FIG. 39, the supporting plate 2 is removed by using etching liquid such as ferric chloride solution. Finally, the resin plate body 3 is also removed through swelling by using aqueous solution of sodium hydroxide or other appropriate liquid. This provides the mold 1 as shown in FIG. 34. Thus, the present embodiment irradiates laser or electron beam (EB) to the main surface of the resin plate body 3 to form the holes 31 and 32, thereby allowing to make the holes 31 and 32 with different depths during one step, and providing similar operation and advantageous effect like the manufacturing method for the mold 1 according to the first and the sixth embodiments.

(Ninth Embodiment)

Figure 40:
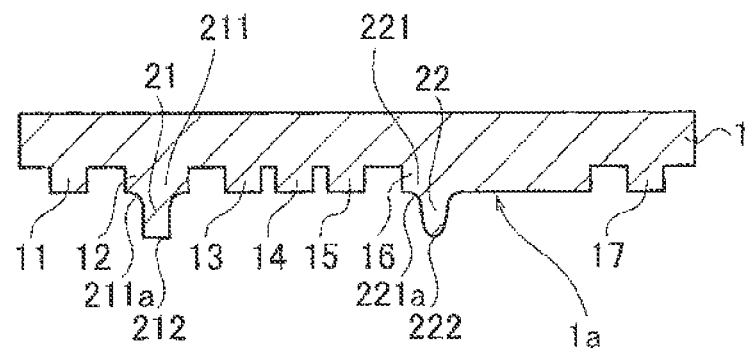
FIG. 40 is a cross-sectional view illustrating one example of a mold according to a ninth embodiment of the present invention

Mold 1 according to the present embodiment has protruding portions 21 and 22 of which top portions 212 and 222 are with different shapes. In the example shown in FIG. 40, the protruding portion 21 has a flat top portion 212 while the protruding portion 22 has a top portion 222 comprised of a curved surface. This allows for providing the mold 1 which is capable of forming via patterns as a combination of penetrating vias and non-penetrating vias during one transferring step, and similar functionality and advantageous effect like the first and the sixth embodiments are obtained.

Here, when forming the flat top portion 212, hole 31 is formed to penetrate resin plate body 3, whereas when forming the top portion 222 comprised of a curved surface, hole 32 is formed not to penetrate the resin plate body 3. The present embodiment uses laser or electron beam to form the holes 31 and 32, thereby allowing to form during one step a form for making the mold 1, which is applicable to the combination of penetrating vias and non-penetrating vias, and similar operation and advantageous effect like the manufacturing method for the mold 1 according to the first and the sixth embodiments are obtained.

It should be appreciated that the embodiments heretofore explained are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 . . . mold
2 . . . supporting plate
3 . . . resin plate body
21, 22 . . . protruding portion
31, 32 . . . hole
111, 121, 211, 221 . . . base portion
111a, 121a, 211a, 221a . . . curved surface
112, 122, 212, 222 . . . top portion
113, 123 . . . slope portion
311, 321 . . . opening area
312, 322 . . . bottom area
313, 323 . . . body area
313a, 323a . . . slope wall
4 . . . resist layer 11-17 ... convex portion
41-47 ... trench
9 ... transfer-purpose resin film

What is claimed is:

1. A manufacturing method for a mold, comprising:
   preparing a resin plate body cured;
   forming a hole in the resin plate body depending on a via pattern by irradiating laser or electron beam to a main surface of the resin plate body;
   laminating, after the forming step, a resist layer on the main surface of the resin plate body formed therein with the hole;
   removing, by a photolithographic method, the resist layer within a predetermined region including an opening region of the hole, depending on a wiring pattern;
   using a mold material to fill the hole formed in the resin plate body and to cover the main surface of the resin plate body: and
   removing the mold from the resist layer and resin plate body.

2. The manufacturing method for a mold as set forth in claim 1, wherein
   the forming a hole in the resin plate body includes irradiating laser or electron beam to the resin plate body such that the hole formed in the resin plate body has at its opening area an inner wall merging into the main surface of the resin plate body with a curvature.

3. The manufacturing method for a mold as set forth in claim 1, wherein
   the forming a hole in the resin plate body includes irradiating laser or electron beam to the resin plate body such that a slope wall is formed which progressively decreases in outer diameter thereof from an inner wall of opening area of the hole formed in the resin plate body to a bottom area.

4. The manufacturing method for a mold as set forth in claim 1, wherein
   the forming a hole in the resin plate body includes irradiating laser or electron beam to the resin plate body such that a given energy by the laser or electron beam gradually decreases from an opening area of the hole to a bottom area of the hole.

5. The manufacturing method for a mold as set forth in claim 1, wherein
   the forming a hole in the resin plate body is such that a beam diameter of the laser when forming an opening area of the hole is larger than a beam diameter of the laser when forming a bottom area of the hole.

6. The manufacturing method for a mold as set forth in claim 1, wherein
   the forming a hole in the resin plate body includes irradiating laser or electron beam to the resin plate body such that the hole formed in the resin plate body has at its opening area an inner wall merging into the main surface of the resin plate body with a curvature, a slope wall is formed which progressively decreases in outer diameter thereof from the inner wall of the opening area of the hole formed in the resin plate body to a bottom area, and the bottom area of the hole is formed in curved surface like.

7. The manufacturing method for a mold as set forth in claim 1,
   wherein
   the use of a mold material to fill the hole formed in the resin plate body includes covering with the mold material the resist layer removed therefrom the predetermined region and the main surface of the resin plate body.

* * * * *